US012038690B2

(12) United States Patent
Wang et al.

(10) Patent No.: US 12,038,690 B2
(45) Date of Patent: Jul. 16, 2024

(54) LASER INTERFERENCE PHOTOLITHOGRAPHY SYSTEM

(71) Applicants: TSINGHUA UNIVERSITY, Beijing (CN); BEIJING U-PRECISION TECH CO., LTD., Beijing (CN)

(72) Inventors: Leijie Wang, Beijing (CN); Yu Zhu, Beijing (CN); Ming Zhang, Beijing (CN); Jitao Xu, Beijing (CN); Xin Li, Beijing (CN); Rong Cheng, Beijing (CN); Kaiming Yang, Beijing (CN); Jinchun Hu, Beijing (CN)

(73) Assignees: TSINGHUA UNIVERSITY, Beijing (CN); BEIJING U-PRECISION TECH CO., LTD., Beijing (CN)

( * ) Notice: Subject to any disclaimer, the term of this patent is extended or adjusted under 35 U.S.C. 154(b) by 0 days.

(21) Appl. No.: 17/767,424

(22) PCT Filed: Oct. 23, 2020

(86) PCT No.: PCT/CN2020/123230
§ 371 (c)(1),
(2) Date: Apr. 7, 2022

(87) PCT Pub. No.: WO2021/083046
PCT Pub. Date: May 6, 2021

(65) Prior Publication Data
US 2024/0053683 A1 Feb. 15, 2024

(30) Foreign Application Priority Data
Oct. 31, 2019 (CN) .......................... 201911050180.3

(51) Int. Cl.
*G03F 7/20* (2006.01)

(52) U.S. Cl.
CPC .................................. *G03F 7/2053* (2013.01)

(58) Field of Classification Search
CPC ..... G02B 5/1857; G03F 7/2053; G03F 7/704; G03F 7/70408; G03F 7/7055
See application file for complete search history.

(56) References Cited

U.S. PATENT DOCUMENTS

2019/0302693 A1* 10/2019 Rothenberg .......... H01S 3/1307
2021/0098973 A1* 4/2021 Gong ..................... G02B 26/06
(Continued)

FOREIGN PATENT DOCUMENTS

CN 102236267 A 11/2011
CN 103092002 A 5/2013
(Continued)

*Primary Examiner* — Deoram Persaud
(74) *Attorney, Agent, or Firm* — HOLZER PATEL DRENNAN (57) ABSTRACT

A laser interference photolithography system, comprising a laser device, a first reflector, a grating beam-splitter, a second reflector, a first universal reflector, a first lens, a second universal reflector, a second lens, a beam splitting prism, a control module, an angle measurement module, a third lens and a substrate. The control module comprises a signal processing terminal, a controller, and a driver. The signal processing terminal is connected to the angle measurement module, the controller is connected to both the signal processing terminal and the driver, and the driver is connected to both the first universal reflector and the second universal reflector. The laser emits a laser light that is split into two beams of light by the system, and the two beams of light are focused on the substrate for exposure.

9 Claims, 3 Drawing Sheets

(56) References Cited

U.S. PATENT DOCUMENTS

| | | | |
|---|---|---|---|
| 2022/0090907 A1* | 3/2022 | Hu | G03F 7/70775 |
| 2022/0221802 A1* | 7/2022 | Cappelli | G01B 9/02097 |
| 2024/0061352 A1* | 2/2024 | Wang | G03F 7/70408 |

FOREIGN PATENT DOCUMENTS

| | | | |
|---|---|---|---|
| CN | 103092003 A | 5/2013 | |
| CN | 106624354 A | 5/2017 | |
| CN | 106773545 A | 5/2017 | |
| CN | 107036528 A | 8/2017 | |
| CN | 107121894 A | 9/2017 | |
| CN | 107643656 A | 1/2018 | |
| CN | 108469643 A | 8/2018 | |
| CN | 2018159848 A | 10/2018 | |
| CN | 110806680 A | 2/2020 | |
| CN | 110837214 A | 2/2020 | |
| JP | S60500100 A | 1/1985 | |
| WO | 0135168 A1 | 5/2001 | |
| WO | 2017125352 A1 | 7/2017 | |

\* cited by examiner

LASER INTERFERENCE PHOTOLITHOGRAPHY SYSTEM

This application claims the priority and benefit of the Chinese Patent Application No. 201911050180.3 filed on Oct. 31, 2019, which is hereby incorporated by reference in its entirety.

TECHNICAL FIELD

This application belongs to the technical field of optical instruments apparatus, in particular, to a laser interference photolithography system, which can be used to manufacture the large-size grating having the gradually changing period.

BACKGROUND ART

Laser interference photolithography is an important technology for manufacturing the micro-nano array device by exposing the photosensitive substrate using the periodic pattern generated by the interference of two or more laser beams, and laser interference photolithography is mainly used to manufacture column array, grating, aperture array, dot array, micro-lens array, and other devices with feature sizes lower than the sub-wavelength. These micro-nano array device are widely used in fields such as national defense, people's livelihood, scientific research, etc.

Regarding Grating devices, as important devices in major engineering systems such as large astronomical telescope, inertial confinement nuclear fusion laser ignition system and photolithography system, etc., the requirements for size, grid line density and accuracy and the like have been continuously improved in recent years. At the same time, the application types of gratings are not limited to one-dimensional gratings, but also include two-dimensional gratings, curved gratings and variable period gratings, etc. Grating manufacturing is advancing to the magnitude order of meter size, nano accuracy and sub-ten thousand grid line density. The manufacturing of large-size gratings with diversified high-accuracy dense grid lines has become a central issue in the field of grating manufacturing. There are different technical defects in traditional grating manufacturing technologies such as mechanical engraving, laser direct writing and mechanical splicing, etc. The main disadvantages of the mechanical engraving include low manufacturing accuracy in large area, long processing cycle and ghost lines existing in the manufactured grating, etc. The main disadvantages of the laser direct writing include low manufacturing accuracy in large area and long processing cycle, etc. The mechanical splicing has poor splicing accuracy and complex splicing process, high cost and other disadvantages. Therefore, it is difficult to manufacture the above-mentioned magnitude order of gratings through traditional technologies. The manufacture of large area gratings with dense grid lines, high accuracy and short processing cycle can be achieved through laser interference photolithography or holographic photolithography, and the laser interference photolithography has gradually become the mainstream of large area and high-accuracy grating manufacturing technologies. The main difficulty in the application of interference photolithography in large-area and high-accuracy grating manufacturing is the research and development of interference photolithography systems, and the research and development of high-accuracy interference photolithography systems are very difficult. Many famous grating manufacturing system companies and research institutions in the world have carried out a series of research on high-accuracy interference photolithography systems. The research mainly focuses on high-accuracy interference photolithography systems, and the research results are disclosed in many patents.

Massachusetts Institute of Technology discloses a scanning laser interference photolithography system in U.S. Pat. No. 6,882,477B1. This photolithography system uses the interference of two collimated small-size beams to form interference patterns to expose the substrate which is performing step scanning motion, so as to realize the manufacturing of large-area gratings. The interference of the collimated small-size beams effectively eliminates the phase nonlinear error of interference patterns; at the same time, in order to prevent the error caused by the phase drift of the system interference pattern relative to the moving substrate platform, this photolithography system exemplifies a pattern locking device based on the heterodyne measurement principle. The pattern locking device generates the frequency difference of heterodyne phase measurement by arranging three acousto-optic modulators in the interference light path, samples the interference beam to the heterodyne phase meter by the beam sampler to perform pattern phase detection, and feeds back the detected phase to the control module to control the acousto-optic modulator to modulate the phase, so as to realize pattern locking. The pattern locking device has the advantages and features of high speed and high accuracy pattern phase locking, but it is only applicable to the manufacturing of one-dimensional or two-dimensional uniform gratings.

Changchun Institute of Optics, Fine Mechanics and Physics, Chinese Academy of Sciences discloses a photolithography system in Chinese Patent CN103698835A. This photolithography system uses a holographic exposure method to manufacture holographic gratings, and uses a heterodyne measurement method to lock the phase of interference fringes relative to the grating substrate at a fixed value. The photolithography system can suppress the shake of high-frequency fringes in the process of exposure, but it cannot realize the manufacturing of large-area variable period gratings. The Institute only discloses the light path adjustment and grid line density adjustment methods of the holographic photolithography system in Chinese Patents CN1544994A, CN101718884A, CN101793988A, etc., and no descriptions on interference system and pattern locking are found. SVG Optronics Co., Ltd discloses a parallel interference photolithography system in Chinese Patent CN101846890. This photolithography system uses grating to split light and uses lens to combine light, but there is no interference pattern phase locking device in the interference photolithography system. Therefore, this laser interference photolithography system is also difficult to realize the manufacturing of large-area and high-accuracy gratings.

Therefore, the manufacturing of the large-size grating having the gradually changing period, especially the manufacturing of the high-accuracy large-size grating having the gradually changing period, has always been a difficult problem in the industry.

SUMMARY

In order to solve the manufacturing problem of the large-size grating having the gradually changing period, the present application provides a laser interference photolithography system, comprising a laser device, a first reflector, a grating beam-splitter, a second reflector, a first universal reflector, a first lens, a second universal reflector, a second lens, a beam splitting prism, a control module, an angle measurement module, a third lens and a substrate, wherein the control module comprises a signal processing terminal, a controller and a driver, and the signal processing terminal is connected with the angle measurement module, and the controller is connected with the signal processing terminal and the driver respectively, and the driver is connected with the first universal reflector and the second universal reflector respectively; and a light path structure of the laser interference photolithography system is as follows:

a laser light is emitted by the laser device to reflected to the grating beam-splitter through the first reflector, and is split into a first beam of light and a second beam of light through the grating beam-splitter;

the first beam of light is reflected by the second reflector, reflected by the first universal reflector and transmitted by the first lens sequentially and propagates to the beam splitting prism, wherein the reflected light through the beam splitting prism propagates to the angle measurement module, and the transmitted light through the beam splitting prism propagates to the third lens and is transmitted by the third lens so as to be focused on the substrate for exposure;

the second beam of light is reflected by the second universal reflector and transmitted by the second lens sequentially and propagates to the beam splitting prism, wherein the transmitted light through the beam splitting prism propagates to the angle measurement module, and the reflected light through the beam splitting prism propagates to the third lens and is transmitted by the third lens so as to be focused on the substrate to expose the substrate;

the angle measurement module measures angles of the first beam of light and the second beam of light input therein, and transmits a measurement finish information to the signal processing terminal; the signal processing terminal processes the measurement finish information and then transmits the processed measurement finish information to the controller; the controller generates a control command according to the received measurement finish information and transmits the control command to the driver; and the driver adjusts angles of the first universal reflector and the second universal reflector according to the control command, so as to change angles of focusing and exposing the first beam of light and the second beam of light onto the substrate, and form the substrate into a grating through focusing and exposing, wherein the laser interference photolithography system further comprises a phase measurement interferometer, a third reflector, a fourth reflector, a third universal reflector, a fourth lens, a beam extracting mirror, a first phase modulator, a second phase modulator and a third phase modulator; the third universal reflector is connected with the driver; the control module further comprises a phase modulation actuator which is connected with the controller, the first phase modulator, the second phase modulator and the third phase modulator respectively; and the phase measurement interferometer is connected with the signal processing terminal;

the first phase modulator is provided between the laser and the first reflector, the laser light is emitted by the laser device to divided into a zero-order diffracted light and a first-order diffracted light through the first phase modulator, wherein the zero-order diffracted light propagates to the first reflector, and the first-order diffracted light passes through the third reflector, the fourth reflector, the third universal reflector and the fourth lens sequentially to become a third input beam of the phase measurement interferometer;

the second phase modulator is provided between the grating beam-splitter and the second reflector; and the third phase modulator is connected and provided between the grating beam-splitter and the second universal reflector;

the beam extracting mirror is provided between the beam splitting prism and the third lens; the first beam of light is reflected by the beam extracting mirror to become a second input beam of the phase measurement interferometer; and the second beam of light is reflected by the beam extracting mirror to become a first input beam of the phase measurement interferometer; and the first input beam, the second input beam and the third input beam propagate through the phase measurement interferometer to obtain two interferometric electrical signals, the two interferometric electrical signals are transmitted to the signal processing terminal, and the signal processing terminal transmits the two interferometric electrical signals to the controller to perform calculation, so as to obtain a phase drift information of exposure fringes, and generate a compensation command and transmit the compensation command to the phase modulation actuator; the phase modulation actuator transmits the compensation command to the first phase modulator, the second phase modulator and the third phase modulator to perform phase modulation, so as to complete locking of the phase drift of the exposure fringes; and the driver adjusts the first universal reflector and the second universal reflector to rotate counterclockwise/clockwise and meanwhile adjusts the third universal reflector to rotate clockwise/counterclockwise according to the control command, so as to ensure that the interferometric signals are always combined, and strengths of the interferometric signals will not weaken correspondingly, and maintain accurate fringe control during exposure process, so as to improve the interference photolithography accuracy for the large-area grating having a gradually changing period.

Preferably, the phase measurement interferometer comprises a first wave plate, a first polarized beam-splitting prism, a second wave plate, a second polarized beam-splitting prism, a polarizer, a first photoelectric detector, a second photoelectric detector, a third polarized beam-splitting prism, a reflector, a third wave plate, a backward reflector and a fourth wave plate; and a light path structure of the phase measurement interferometer is as follows:

the third input beam is input into the first wave plate, changed into a circular polarization state through the first wave plate, and then incident on the first polarized beam-splitting prism; wherein the reflected light through the first polarized beam-splitting prism passes through the fourth wave plate and propagates to the backward reflector, and is reflected back to the fourth wave plate through the backward reflector to be changed into p polarization state, and then is transmitted through the first polarized beam-splitting prism and the second polarized beam-splitting prism sequentially, and subsequentially passes through the polarizer to form a first reference light; and the transmitted light through the first polarized beam-splitting prism passes through the third wave plate and propagates to the reflector, and is reflected back to the third wave plate through the reflector to be changed into s polarization state and propagates to the first polarized beam-splitting prism, and then is reflected to the second wave plate through the first polarized beam-splitting prism to be changed into p polarization state, and subsequentially is transmitted by the second polarized beam-splitting prism and passes through the polarizer to form a second reference light;

the first input beam is input into the third polarized beam-splitting prism in s polarization state, reflected to the second polarized beam-splitting prism through the third polarized beam-splitting prism, and then reflected to the polarizer through the second polarized beam-splitting prism to form a first measurement light;

the second input beam is parallel to the first input beam, input into the third polarized beam-splitting prism in s polarization state, reflected to the second polarized beam-splitting prism through the third polarized beam-splitting prism, and then reflected to the polarizer through the second polarized beam-splitting prism to form a second measurement light;

the first measurement light and the first reference light are combined to form a beam of interferometric signal to incident on the first photoelectric detector, and the second measurement light and the second reference light are combined to form another beam of interferometric signal to incident on the second photoelectric detector; and the first photoelectric detector and the second photoelectric detector convert the received interferometric signals into electrical signals respectively, and then transmit the electrical signals to the signal processing terminal.

Further, the first lens, the second lens, the third lens and the fourth lens are convex lenses.

Further, the second phase modulator and the third phase modulator are acousto-optic modulators.

Further, the first wave plate is a quarter wave plate.

Further, the second wave plate is a half wave plate.

Further, the third wave plate is a quarter wave plate.

Further, the fourth wave plate is a quarter wave plate.

Further, the control module further comprises a display screen, which is connected with the controller to realize data visualization.

The laser interference photolithography system of the present application uses the angle measurement module to measure the angles of the exposure beams. When the system performs the interference photolithography on the grating having the gradually changing period, the controller transmits the control command for changing the angles to the driver according to the measurement results output by the angle measurement module and the periodic change requirements of grating manufacturing, and the driver adjusts the corresponding angles of the first universal reflector and the second universal reflector to complete the control of the angles of the exposure beams. In the process of the photolithography, the grating substrate moves in a scanning step manner along the focus plane of the exposure beams, and the manufacturing of the grating having the gradually changing period can be completed. The size of the grating manufactured by scanning interference photolithography is not limited by the size of the exposure spot, and the large-size grating having the gradually changing period can be manufactured.

In the drawings: 1—laser, 2—first reflector, 3—grating beam-splitter, 401—second reflector, 402—first universal reflector, 403—first lens, 501—second universal reflector, 502—second lens, 6—beam splitting prism, 7—phase measurement interferometer, 701—first wave plate, 702—first polarized beam-splitting prism, 703—second wave plate, 704—second polarized beam-splitting prism, 705—polarizer, 706—first photoelectric detector, 707—second photoelectric detector, 708—third polarized beam-splitting prism, 709—second input beam, 710—first input beam, 711—reflector, 712—third wave plate, 713—backward reflector, 714—fourth wave plate, 715—third input beam, 8—control module, 801—signal processing terminal, 802—controller, 803—driver, 804—phase modulation actuator, 9—angle measurement module, 10—third lens, 11—substrate, 12—third reflector, 13—fourth reflector, 14—third universal reflector, 15—fourth lens, 16—beam extracting mirror, 17—first phase modulator, 18—second phase modulator, 19—third phase modulator.

DETAILED DESCRIPTION OF EMBODIMENTS

In order to further set forth the technical means for solving the technical problems and the technical effects of the present application, the present application is further described in detail below in combination with the accompanying drawings and specific embodiments. It should be noted that the accompanying drawings provided are schematic and are not drawn according to size or scale completely; therefore, the protection scope of the present application is not limited to the accompanying drawings and specific embodiments.

Figure 1:
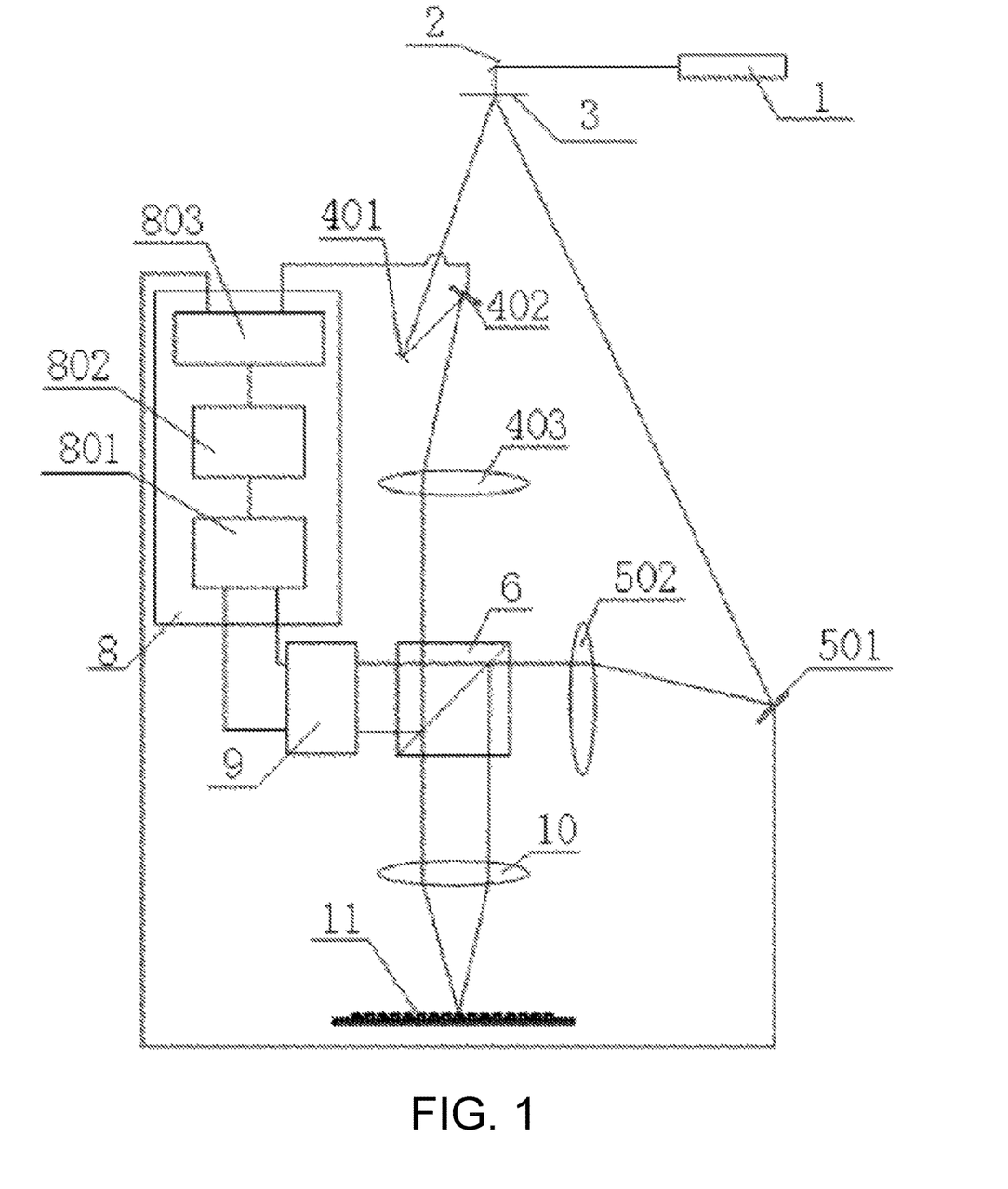
FIG. 1 is a schematic diagram of the first embodiment of the laser interference photolithography system of the present application.

An optional embodiment of the laser interference photolithography system shown in FIG. 1 comprises a laser device 1, a first reflector 2, a grating beam-splitter 3, a second reflector 401, a first universal reflector 402, a first lens 403, a second universal reflector 501, a second lens 502, a beam splitting prism 6, a control module 8, an angle measurement module 9, a third lens 10 and a substrate 11; and the control module 8 comprises a signal processing terminal 801, a controller 802 and a driver 803. The signal processing terminal 801 is connected with the angle measurement module 9, the controller 802 is connected with the signal processing terminal 801 and the driver 803 respectively, and the driver 803 is connected with the first universal reflector 402 and the second universal reflector 501 respectively. The light path structure of the system is as follows:

a laser light is emitted by the laser device 1 to reflected to the grating beam-splitter 3 through the first reflector 2, and is split into a first beam of light and a second beam of light through the grating beam-splitter 3;

the first beam of light is reflected by the second reflector 401, reflected by the first universal reflector 402 and transmitted by the first lens 403 sequentially and propagates to the beam splitting prism 6, wherein the reflected light through the beam splitting prism 6 propagates to the angle measurement module 9, and the transmitted light through the beam splitting prism 6 propagates to the third lens 10 and is transmitted by the third lens 10 so as to be focused on the substrate 11 to expose the substrate 11;

the second beam of light is reflected by the second universal reflector 501 and transmitted by the second lens 502 sequentially and propagates to the beam splitting prism 6, wherein the transmitted light through the beam splitting prism 6 propagates to the angle measurement module 9, and the reflected light through the beam splitting prism 6 propagates to the third lens 10 and is transmitted by the third lens 10 so as to be focused on the substrate 11 to expose the substrate 11;

the angle measurement module 9 measures angles of the first beam of light and the second beam of light input therein, and transmits a measurement finish information to the signal processing terminal 801; the signal processing terminal 801 processes the measurement finish information and transmits the processed measurement finish information to the controller 802; the controller 802 generates a control command according to the received information and transmits the control command to the driver 803; and the driver 803 adjusts angles of the first universal reflector 402 and the second universal reflector 501 according to the control command, so as to change angles of focusing and exposing the first beam of light and the second beam of light onto the substrate 11, and form the substrate 11 into a grating through focusing exposing.

Figure 2:
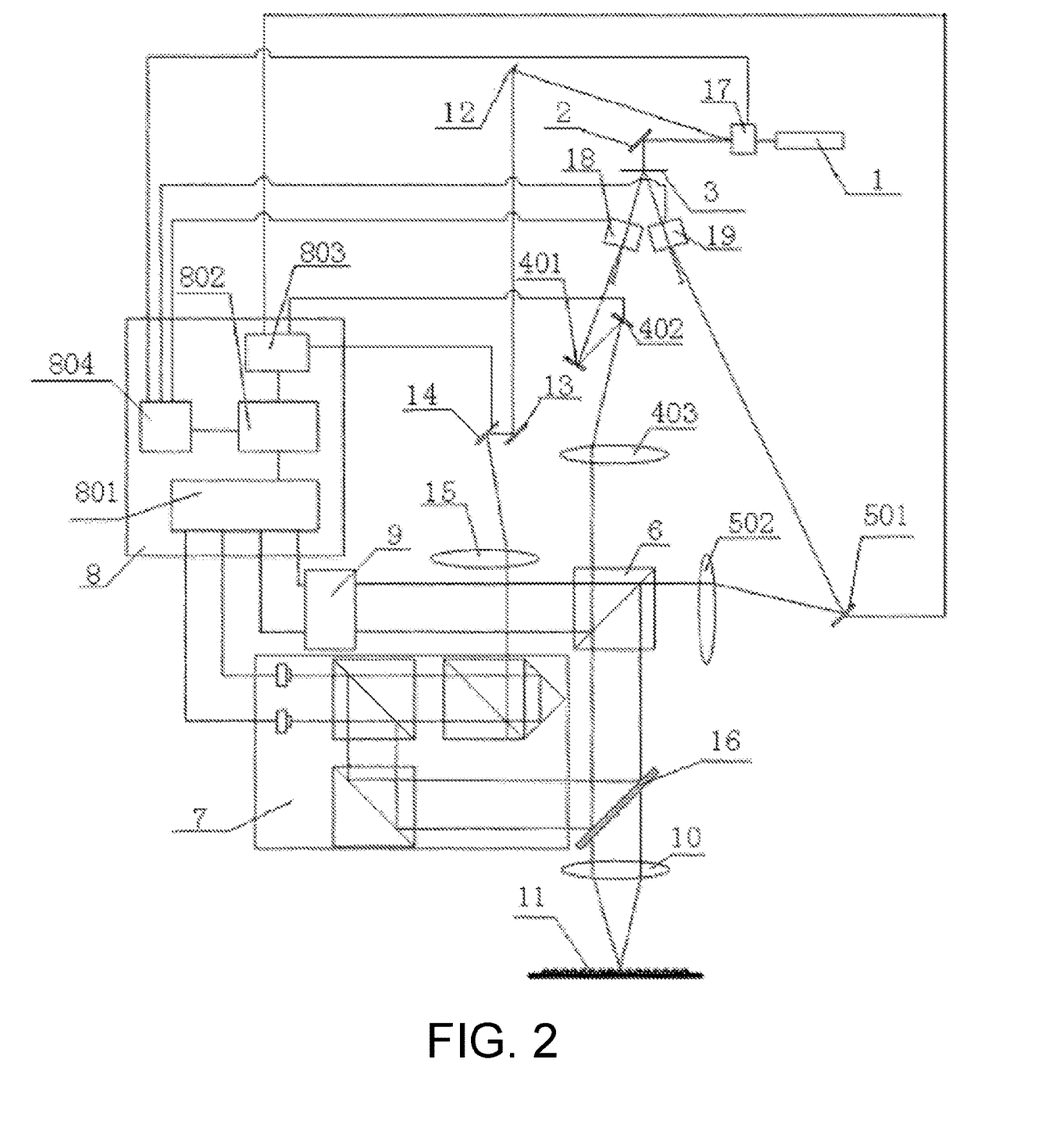
FIG. 2 is a schematic diagram of the second embodiment of the laser interference photolithography system of the present application.

An optional embodiment of the laser interference photolithography system shown in FIG. 2 comprises a laser device 1, a first reflector 2, a grating beam-splitter 3, a second reflector 401, a first universal reflector 402, a first lens 403, a second universal reflector 501, a second lens 502, a beam splitting prism 6, a phase measurement interferometer 7, a control module 8, an angle measurement module 9, a third lens 10, a substrate 11, a third reflector 12, a fourth reflector 13, a third universal reflector 14, a fourth lens 15, a beam extracting mirror 16, a first phase modulator 17, a second phase modulator 18 and a third phase modulator 19; and the control module 8 comprises a signal processing terminal 801, a controller 802, a driver 803 and a phase modulation actuator 804. The signal processing terminal 801 is connected with the angle measurement module 9 and the phase measurement interferometer 7, and the controller 802 is connected with the signal processing terminal 801, the driver 803 and the phase modulation actuator 804, and the driver 803 is connected with the first universal reflector 402, the second universal reflector 501 and the third universal reflector 14; the phase modulation actuator 804 is connected with the first phase modulator 17, the second phase modulator 18 and the third phase modulator 19 respectively; and the first lens, the second lens, the third lens and the fourth lens are convex lenses, and the second phase modulator 18 and the third phase modulator 19 may adopt acousto-optic modulators. The light path structure of the laser interference photolithography system is as follows:

a laser light emitted by the laser device 1 is divided into a zero-order diffracted light and a first-order diffracted light through the first phase modulator 17, wherein the zero-order diffracted light is reflected to the grating beam-splitter 3 by the first reflector 2, and is split into a first beam of light and a second beam of light through the grating beam-splitter 3;

the first beam of light passes through the second phase modulator 18, is reflected by the second reflector 401, is reflected by the first universal reflector 402, and is transmitted by the first lens 403 sequentially, and propagates to the beam splitting prism 6; the reflected light through the beam splitting prism 6 propagates to the angle measurement module 9, and the transmitted light through the beam splitting prism 6 propagates to the beam extracting mirror 16; wherein the reflected beam reflected and separated by the beam extracting mirror 16 becomes a second input beam 709 of the phase measurement interferometer 7, and the transmitted beam through the beam extracting mirror 16 is transmitted by the third lens 10 to be focused on the substrate 11 to expose the substrate 11;

the second beam of light passes through the third phase modulator 19, is reflected by the second universal reflector 501 and is transmitted by the second lens 502 sequentially, and propagates to the beam splitting prism 6, and the transmitted light through the beam splitting prism 6 propagates to the angle measurement module 9, the reflected light through the beam splitting prism 6 propagates to the beam extracting mirror 16; and the reflected beam reflected and separated by the beam extracting mirror 16 becomes a first input beam 710 of the phase measurement interferometer 7, and the transmitted beam through the beam extracting mirror 16 is transmitted by the third lens 10 to be focused on the substrate 11 to expose the substrate 11;

the first-order diffracted light separated from the first phase modulator 17 is reflected by the third reflector 12, the fourth reflector 13 and the third universal reflector 14 sequentially, and then transmitted by the fourth lens 15 to become a third input beam 715 of the phase measurement interferometer 7.

Figure 3:
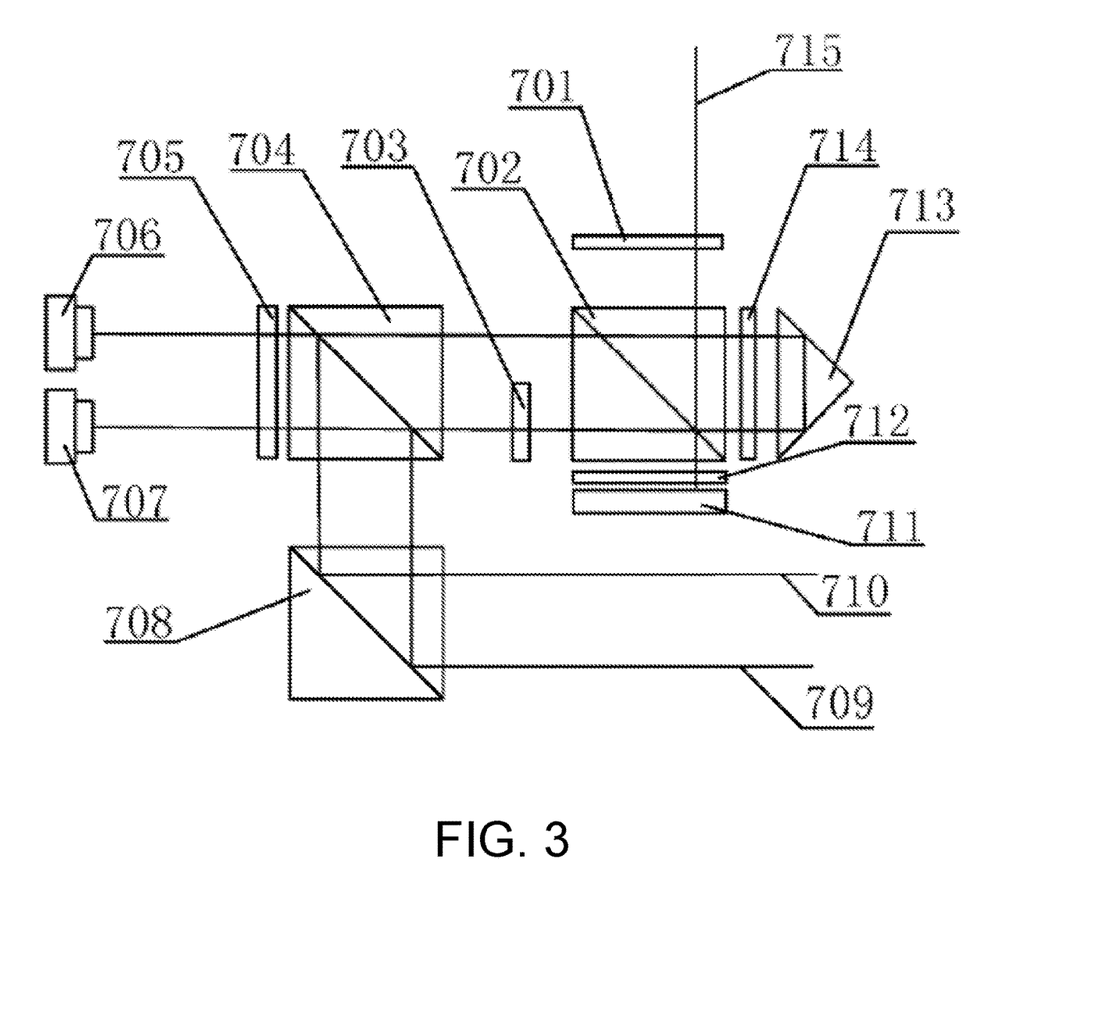
FIG. 3 is a schematic diagram of the light path structure of the phase measurement interferometer.

The structure of the phase measurement interferometer 7 is shown in FIG. 3, and the phase measurement interferometer 7 comprises a first wave plate 701, a first polarized beam-splitting prism 702, a second wave plate 703, a second polarized beam-splitting prism 704, a polarizer 705, a first photoelectric detector 706, a second photoelectric detector 707, a third polarized beam-splitting prism 708, a reflector 711, a third wave plate 712, a backward reflector 713 and a fourth wave plate 714; the signal processing terminal 801 is connected with the first photoelectric detector 706 and the second photoelectric detector 707 of the phase measurement interferometer 7; and the first wave plate 701, the third wave plate 712 and the fourth wave plate 714 are quarter wave plates, and the second wave plate 703 is a half wave plate. The light path structure of the phase measurement interferometer 7 is as follows:

the third input beam 715 has an additional frequency $f_{s3}$ and is input into the first wave plate 701, and is changed into the circular polarization state from the s polarization state through the first wave plate 701, and then incident on the first polarized beam-splitting prism 702; the reflected light through the first polarized beam-splitting prism 702 passes through the fourth wave plate 714 and propagates to the backward reflector 713, and is reflected back to the fourth wave plate 714 through the backward reflector 713 to be changed into the p polarization state, and then is transmitted by the first polarized beam-splitting prism 702 and the second polarized beam-splitting prism 704 sequentially, and subsequently passes through the polarizer 705 to form a first reference light; and the transmitted light through the first polarized beam-splitting prism 702 passes through the third wave plate 712 and propagates to the reflector 711, is reflected back to the third wave plate 712 through the reflector 711 to be changed into the s polarization state and propagates to the first polarized beam-splitting prism 702, and is reflected to the second wave plate 703 through the first polarized beam-splitting prism 702 to be changed into the p polarization state, and then is transmitted by the second polarized beam-splitting prism 704 and passes through the polarizer 705 to form a second reference light;

the first input beam 710 having an additional frequency $f_{s1}$ is input into the third polarized beam-splitting prism 708 in the s polarization state, reflected to the second polarized beam-splitting prism 704 through the third polarized beam-splitting prism 708, and then reflected to the polarizer 705 through the second polarized beam-splitting prism 704 to form a first measurement light;

the second input beam 709 is parallel to the first input beam 710, has an additional frequency $f_{s2}$, is input into the third polarized beam-splitting prism 708 in the s polarization state, reflected to the second polarized beam-splitting prism 704 through the third polarized beam-splitting prism 708, and then reflected to the polarizer 705 through the second polarized beam-splitting prism 704 to form a second measurement light;

the first measurement light and the first reference light are combined to form a beam of interferometric signal to incident on the first photoelectric detector 706, and the second measurement light and the second reference light are combined to form another beam of interferometric signal to incident on the second photoelectric detector 707; and the first photoelectric detector 706 and the second photoelectric detector 707 convert the received interferometric signals into electrical signals respectively;

the first input beam 710, the second input beam 709 and the third input beam 715 pass through the phase measurement interferometer 7 to obtain two interferometric electrical signals; during interference photolithography of the grating having the gradually changing period, the two interferometric electrical signals are transmitted to the signal processing terminal 801, and the signal processing terminal 801 transmits the two interferometric electrical signals to the controller 802 to perform calculation, so as to obtain a phase drift information of exposure fringes, and generate and transmit a compensation command to the phase modulation actuator 804; the phase modulation actuator 804 transmits the compensation command to the first phase modulator 17, the second phase modulator 18 and the third phase modulator 19 to perform phase modulation, so as to complete the locking of the phase drift of the exposure fringes; the angle information of the first beam of light and the second beam of light detected by the angle measurement module 9 are transmitted to the signal processing terminal 801, the signal processing terminal 801 transmits the angle information to the controller 802, and the controller 802 calculates the adjustment amount required for the angles of the exposure beams, and transmits the information on the adjustment amount of the angles to the driver 803 in combination with the measurement results; and the driver 803 controls the first universal reflector 402, the second universal reflector 501 and the third universal reflector 14 to adjust angles, so as to achieve the purpose of adjusting the exposure angles, wherein if the grating period needs to be increased/reduced, the angles of the exposure beams are reduced/increased correspondingly, and the spacing of the exposure beams is also reduced/increased; and the control module outputs a command through the driver thereof to adjust the first universal reflector 402 and the second universal reflector 501 to rotate counterclockwise/clockwise, and meanwhile adjust the third universal reflector 14 to rotate clockwise/counterclockwise, so as to ensure that the interferometric signals are always combined, and strengths of the interferometric signals will not be weaken, and maintain accurate fringe control during exposure process, thereby improving the interference photolithography accuracy for the large-area grating having the gradually changing period.

The generating principle of the interferometric signals of the phase measurement interferometer used in the present application will be further described below.

The light vector matrix of the first input beam s1 may be expressed as:

$$E_{s1} = E_1 expi(-2\pi f_{s1} t + \varphi_{s1}) \begin{bmatrix} 0 \\ 1 \end{bmatrix}$$

wherein:
$E_{s1}$ represents the light vector matrix of the first input beam s1;
$E_1$ represents the amplitude of the first input beam s1;
i represents the imaginary unit;
$f_{s1}$ represents the vibration frequency of the first input beam s1 including the additional frequency;
t represents the time that the laser propagates forward in the space;
$\varphi_{s1}$ represents the initial phase of the first input beam s1.

The light vector matrix of the second input beam s2 may be expressed as:

$$E_{s2} = E_2 expi(-2\pi f_{s2} t + \varphi_{s2}) \begin{bmatrix} 0 \\ 1 \end{bmatrix}$$

wherein:
$E_{s2}$ represents the light vector matrix of the second input beam s2;
$E_2$ represents the amplitude of the second input beam s2;
$f_{s2}$ represents the vibration frequency of the second input beam s2 including the additional frequency;
$\varphi_{s2}$ represents the initial phase of the second input beam s2.

The third input beam s3 is a heterodyne measurement reference beam, and its light vector matrix may be expressed as:

$$E_{s3} = E_3 expi(-2\pi f_{s3} t + \varphi_{s3}) \begin{bmatrix} 0 \\ 1 \end{bmatrix}$$

wherein:
$E_{s3}$ represents the light vector matrix of the third input beam s3;
$E_3$ represents the amplitude of the third input beam s3;
$f_{s3}$ represents the vibration frequency of the third input beam s3 including the additional frequency;
$\varphi_{s3}$ represents the initial phase of the third input beam s3.

The first measurement light is formed by passing the first input beam s1 through the following light path: s1→PBSR3 (reflected by the third polarized beam-splitting prism)→PBSR2 (reflected by the second polarized beam-splitting prism)→PF (the polarizer arranged at an angle of 45°). Therefore, the light vector of the first measurement light is:

$$E_{s11} = J_{PF}J_{PBSR3}J_{PBSR2}E_{s1} = E_1 expi(-2\pi f_{s1}t + \varphi_{s1})\begin{bmatrix}1\\1\end{bmatrix}$$

wherein:

$E_{s11}$ represents the light vector matrix of the first measurement light;

$J_{PF}$ represents the Jones matrix of the transmitted light path of the polarizer;

$J_{PBSR2}$ represents the Jones matrix of the reflected light path of the second polarized beam-splitting prism;

$J_{PBSR3}$ represents the Jones matrix of the reflected light path of the third polarized beam-splitting prism.

The first reference light is formed by splitting the third input beam s3 passing through the following light path: s3→QW1 (the first wave plate with the fast axis arranged at an angle of 45°)→PBSR1 (reflected by the first polarized beam-splitting prism)→QW4 (the fourth wave plate with the fast axis arranged at an angle of 45°)→RR (backward reflector)→QW4 (the fourth wave plate with the fast axis arranged at an angle of 45°)→PBST1 (transmitted by the first polarized beam-splitting prism)→PBST2 (transmitted by the second polarized beam-splitting prism)→PF (the polarizer arranged at an angle of 45°). Therefore, the light vector of the first reference light is:

$$E_{s31} = J_{PF}J_{PBST1}J_{PBST2}J_{QW1}J_{RR}J_{QW4}J_{PBSR1}J_{QW4}E_{s3} = \\ E_3\, expi(-2\pi f_{s3}t + \varphi_{s3})\begin{bmatrix}1+i\\1+i\end{bmatrix}$$

wherein:

$E_{s31}$ represents the light vector matrix of the first reference light;

$J_{PBST1}$ represents the Jones matrix of the transmitted light path of the first polarized beam-splitting prism;

$J_{PBST2}$ represents the Jones matrix of the transmitted light path of the second polarized beam-splitting prism;

$J_{QW1}$ represents the matrix of the transmitted light path of the first wave plate;

$J_{QW4}$ represents the matrix of the transmitted light path of the fourth wave plate.

The first measurement light and the first reference light are combined to form a beam of interferometric signal to incident on the first photoelectric detector 706. Therefore, the light intensity value of the interferometric signal obtained by the first photoelectric detector 706 can be obtained as follows:

$$I_1 = \overline{(E_{s11}+E_{s31})}(E_{s11}+E_{s31}) = E_1^2 + E_3^2 + 2E_1E_3\cos(-2\pi\Delta f_1 t + \Delta\varphi_1)$$

wherein:

$I_1$ represents the light intensity of the interferometric light signal formed by combining the first measurement light and the first reference light;

$\Delta f_1$ represents the vibration frequency of the interferometric light signal formed by combining the first measurement light and the first reference light;

$\Delta\varphi_1$ represents the phase of the interferometric light signal formed by combining the first measurement light and the first reference light.

The second measurement light is formed by passing the second input beam s2 through the following light path: s2→PBSR3 (reflected by the third polarized beam-splitting prism)→PBSR2 (reflected by the second polarized beam-splitting prism)→PF (the polarizer arranged at an angle of 45°). Therefore, the light vector of the second measurement light is:

$$E_{s21} = J_{PF}J_{PBSR2}J_{PBSR3}E_{s2} = E_2 expi(-2\pi f_{s2}t + \varphi_{s2})\begin{bmatrix}1\\1\end{bmatrix}$$

wherein:

$E_{s21}$ represents the light vector matrix of the second measurement light.

The second reference light is formed by splitting the third input beam s3 passing through the following light path: s3→QW1 (the first wave plate with the fast axis arranged at an angle of 45°)→PBST1 (transmitted by the first polarized beam-splitting prism)→QW3 (the third wave plate with the fast axis arranged at an angle of 45°)→R (the reflector) →QW3 (the third wave plate with the fast axis arranged at an angle of 45°)→PBSR1 (reflected by the first polarized beam-splitting prism)→HW (the second wave plate arranged at an angle of 45°)→PBST2 (transmitted by the second polarized beam-splitting prism)→PF (the polarizer arranged at an angle of 45°). Therefore, the light vector of the second reference light is:

$$E_{s32} = J_{PF}J_{PBST1}J_{HW}J_{PBSR1}J_{QW1}J_R J_{QW3}J_{PBST2}J_{QW3}E_{s3} = \\ E_3 expi(-2\pi f_{s3}t + \varphi_{s3})\begin{bmatrix}1+i\\1+i\end{bmatrix}$$

wherein:

$E_{s32}$ represents the light vector matrix of the second reference light;

$J_{PBSR1}$ represents the Jones matrix of the reflected light path of the first polarized beam-splitting prism;

$J_{QW3}$ represents the matrix of the transmitted light path of the third wave plate;

$J_{HW}$ represents the matrix of the transmitted light path of the second wave plate.

The second measurement light and the second reference light are combined to form another beam of interferometric signal to incident on the second photoelectric detector 707. Therefore, the light intensity value of the interferometric signal obtained by the second photoelectric detector 707 can be obtained as follows:

$$I_2 = (E_{s21}+E_{s32})\overline{(E_{s21}+E_{s32})} = E_2^2 + E_3^2 + 2E_2E_3\cos(-2\pi\Delta f_2 t + \Delta\varphi_2)$$

wherein:

$I_2$ represents the light intensity of the interferometric light signal formed by combining the second measurement light and the second reference light;

$\Delta f_2$ represents the vibration frequency of the interferometric light signal formed by combining the second measurement light and the second reference light;

$\Delta\varphi_2$ represents the phase of the interferometric light signal formed by combining the second measurement light and the second reference light.

The two interferometric light signals formed by combining light have the same frequency difference, include the phase information of the measured input beams s1 and s2 and the input heterodyne reference light s3, and are transmitted to the controller through the signal processing terminal to be processed after being converted into electrical signals, so as to calculate the phase of the exposure beam, and complete the phase measurement of the exposure beam.

It should be noted that all of the above parameters adopt international standard units.

Obviously, the present application can also have a variety of other embodiments. For example, the control module may comprise a display screen, which is connected with the controller to realize data visualization. Those skilled in the art may make various corresponding changes and deformations according to the present application without departing from the spirit and essence of the present application, and these corresponding changes and deformations belong to the protection scope of the claims of the present application.

The invention claimed is:

1. A laser interference photolithography system, comprising a laser device, a first reflector, a grating beam-splitter, a second reflector, a first universal reflector, a first lens, a second universal reflector, a second lens, a beam splitting prism, a control module, an angle measurement module, a third lens and a substrate, wherein the control module comprises a signal processing terminal, a controller and a driver, the signal processing terminal is connected with the angle measurement module, the controller is connected with the signal processing terminal and the driver respectively, and the driver is connected with the first universal reflector and the second universal reflector respectively; a light path structure of the laser interference photolithography system is as follows:

a light is emitted by the laser device to reflected to the grating beam-splitter through the first reflector, and is split into a first beam of light and a second beam of light through the grating beam-splitter;

the first beam of light is reflected by the second reflector, reflected by the first universal reflector and transmitted by the first lens sequentially and propagates to the beam splitting prism, a reflected light through the beam splitting prism propagates to the angle measurement module, and a transmitted light through the beam splitting prism propagates to the third lens and is transmitted by the third lens so as to be focused on the substrate for exposure;

the second beam of light is reflected by the second universal reflector and transmitted by the second lens sequentially and propagates to the beam splitting prism, a transmitted light through the beam splitting prism propagates to the angle measurement module, and a reflected light through the beam splitting prism propagates to the third lens and is transmitted by the third lens so as to be focused on the substrate for exposure;

the angle measurement module measures angles of the first beam of light and the second beam of light input therein, and transmits a measurement finish information to the signal processing terminal, the signal processing terminal processes the measurement finish information and then transmits the processed measurement finish information to the controller, the controller generates a control command according to the received processed measurement finish information and transmits the control command to the driver, and the driver adjusts angles of the first universal reflector and the second universal reflector according to the control command, so as to change angles of the first beam of light and the second beam of light focusing and exposing onto the substrate, and form the substrate into a grating through focusing and exposing, wherein the laser interference photolithography system further comprises a phase measurement interferometer, a third reflector, a fourth reflector, a third universal reflector, a fourth lens, a beam extracting mirror, a first phase modulator, a second phase modulator and a third phase modulator, the third universal reflector is connected with the driver, the control module further comprises a phase modulation actuator which is connected with the controller, the first phase modulator, the second phase modulator and the third phase modulator respectively, and the phase measurement interferometer is connected with the signal processing terminal;

the first phase modulator is provided between the laser device and the first reflector, a light is emitted by the laser device to divided into a zero-order diffracted light and a first-order diffracted light through the first phase modulator, the zero-order diffracted light propagates to the first reflector, and the first-order diffracted light passes through the third reflector, the fourth reflector, the third universal reflector and the fourth lens sequentially to become a third input beam of the phase measurement interferometer;

the second phase modulator is provided between the grating beam-splitter and the second reflector, and the third phase modulator is connected and provided between the grating beam-splitter and the second universal reflector;

the beam extracting mirror is provided between the beam splitting prism and the third lens, the first beam of light is reflected by the beam extracting mirror to become a second input beam of the phase measurement interferometer, and the second beam of light is reflected by the beam extracting mirror to become a first input beam of the phase measurement interferometer; and the first input beam, the second input beam and the third input beam propagate through the phase measurement interferometer to obtain two interferometric electrical signals, the two interferometric electrical signals are transmitted to the signal processing terminal, and the two interferometric electrical signals are transmitted to the controller to perform calculation, so as to obtain a phase drift information of exposure fringes, and generate a compensation command and transmit the compensation command to the phase modulation actuator, the phase modulation actuator transmits the compensation command to the first phase modulator, the second phase modulator and the third phase modulator to perform phase modulation, so as to complete locking of a phase drift of the exposure fringes, and the driver adjusts the first universal reflector and the second universal reflector to rotate counterclockwise/clockwise, and meanwhile adjusts the third universal reflector to rotate clockwise/counterclockwise according to the control command, so as to ensure that the interferometric signals are always combined, and strengths of the interferometric signals will not be weaken correspondingly, and maintain accurate fringe control during exposure process, so as to improve interference photolithography accuracy for a large-area grating having a gradually changing period.

2. The laser interference photolithography system according to claim 1, wherein the phase measurement interferometer comprises a first wave plate, a first polarized beam-splitting prism, a second wave plate, a second polarized beam-splitting prism, a polarizer, a first photoelectric detector, a second photoelectric detector, a third polarized beam-splitting prism, a reflector, a third wave plate, a backward reflector and a fourth wave plate; and a light path structure of the phase measurement interferometer is as follows:

the third input beam is input into the first wave plate, changed into a circular polarization state through the first wave plate and then incident on the first polarized beam-splitting prism, the reflected light through the first polarized beam-splitting prism passes through the fourth wave plate and propagates to the backward reflector, and is reflected back to the fourth wave plate through the backward reflector to be changed in a p polarization state, and then is transmitted by the first polarized beam-splitting prism and the second polarized beam-splitting prism sequentially, and then passes through the polarizer to form a first reference light; and the transmitted light through the first polarized beam-splitting prism passes through the third wave plate and propagates to the reflector, and is reflected back to the third wave plate through the reflector to be changed in a s polarization state and propagates to the first polarized beam-splitting prism, and then is reflected to the second wave plate through the first polarized beam-splitting prism to be changed in the p polarization state, and is then transmitted by the second polarized beam-splitting prism and passes through the polarizer to form a second reference light;

the first input beam is input into the third polarized beam-splitting prism in a s polarization state, reflected to the second polarized beam-splitting prism through the third polarized beam-splitting prism, and then reflected to the polarizer through the second polarized beam-splitting prism to form a first measurement light;

the second input beam is parallel to the first input beam, input into the third polarized beam-splitting prism in a s polarization state, reflected to the second polarized beam-splitting prism through the third polarized beam-splitting prism, and then reflected to the polarizer through the second polarized beam-splitting prism to form a second measurement light;

the first measurement light and the first reference light are combined to form a beam of interferometric signal to incident on the first photoelectric detector, and the second measurement light and the second reference light are combined to form another beam of interferometric signal to incident on the second photoelectric detector; and the first photoelectric detector and the second photoelectric detector convert the received interferometric signals into electrical signals respectively, and then transmit the electrical signals to the signal processing terminal.

3. The laser interference photolithography system according to claim 2, wherein the third wave plate is a quarter wave plate.

4. The laser interference photolithography system according to claim 2, wherein the fourth wave plate is a quarter wave plate.

5. The laser interference photolithography system according to claim 1, wherein the first lens, the second lens, the third lens and the fourth lens are convex lenses.

6. The laser interference photolithography system according to claim 1, wherein the second phase modulator and the third phase modulator are acousto-optic modulators.

7. The laser interference photolithography system according to claim 2, wherein the first wave plate is a quarter wave plate.

8. The laser interference photolithography system according to claim 2, wherein the second wave plate is a half wave plate.

9. The laser interference photolithography system according to claim 1, wherein the control module further comprises a display screen, which is connected with the controller to realize data visualization.

* * * * *